United States Patent
Oyake et al.

(10) Patent No.: US 7,297,472 B2
(45) Date of Patent: Nov. 20, 2007

(54) PROCESSING METHOD FOR PHOTORESIST MASTER, PRODUCTION METHOD FOR RECORDING MEDIUM-USE MATER, PRODUCTION METHOD FOR RECORDING MEDIUM, PHOTORESIST MASTER, RECORDING MEDIUM-USE MASTER AND RECORDING MEDIUM

(75) Inventors: Hisaji Oyake, Tokyo (JP); Tatsuya Kato, Tokyo (JP); Hajime Utsunomiya, Tokyo (JP); Masanori Shibahara, Tokyo (JP); Kenji Yoneyama, Tokyo (JP)

(73) Assignee: TDK Corporation, Tokyo (JP)

( * ) Notice: Subject to any disclaimer, the term of this patent is extended or adjusted under 35 U.S.C. 154(b) by 129 days.

(21) Appl. No.: 10/507,429

(22) PCT Filed: Mar. 10, 2003

(86) PCT No.: PCT/JP03/02766

§ 371 (c)(1),
(2), (4) Date: Sep. 10, 2004

(87) PCT Pub. No.: WO03/077239

PCT Pub. Date: Sep. 18, 2003

(65) Prior Publication Data

US 2005/0142320 A1 Jun. 30, 2005

(30) Foreign Application Priority Data

Mar. 11, 2002 (JP) ............................ 2002-065814

(51) Int. Cl.
*G11B 7/45* (2006.01)
*G11B 7/26* (2006.01)

(52) U.S. Cl. ...................... 430/321; 430/945; 430/320

(58) Field of Classification Search ..................... None
See application file for complete search history.

(56) References Cited

U.S. PATENT DOCUMENTS 4,259,433 A 3/1981 Mizobuchi et al. ......... 430/296

(Continued)

FOREIGN PATENT DOCUMENTS

JP 52-154403 12/1977

(Continued)

OTHER PUBLICATIONS

Machine translation of JP 09-237420.*
Machine translation of jp-2000-276780.*
Machien translation of Jp 2000-276782.*

*Primary Examiner*—Martin J. Angebranndt
(74) *Attorney, Agent, or Firm*—Seed IP Law Group PLLC

(57) ABSTRACT

The present invention relates to a method for processing a photoresist-coated board, a method for manufacturing a stamper for a recording medium and a method for manufacturing a recording medium which can form a fine raised and depressed pattern having a uniform width after development even in the case where a laser beam having a relatively long wavelength is used for forming pre-pits on a recording medium with high accuracy. A photoresist-coated board 108 is constituted by laminating a light absorption layer 108*b* and a photosensitive material layer 108*c* on a glass substrate 108*a* in this order and is exposed to a laser beam 102 by condensing the laser beam 102 onto the photosensitive material layer 108*c*, thereby forming a raised and depressed pattern corresponding to pre-pits on the the photosensitive material layer 108. When the length of a pre-pit to be formed is shorter than 4 T, for example, the duty ratio of the pulse signal train input to the light modulator 109 is varied within a range from about 50% to 65% so that a pulse signal train having a higher duty ratio is generated as the length of a pre-pit to be formed becomes longer and the power of a laser beam is modulated by the thus generated pulse signal train. On the other hand, when the length of a pre-pit to be formed is equal to or longer than 4 T, for example, a pulse signal train having a constant duty ratio is generated independently of the length of the pre-pit to be formed and the power of a laser beam is modulated by the thus generated pulse signal train.

9 Claims, 6 Drawing Sheets

U.S. PATENT DOCUMENTS

| | | | |
|---|---|---|---|
| 4,447,519 A | 5/1984 | Pritikin | 430/275 |
| 4,615,969 A | 10/1986 | Strand | 430/320 |
| 4,737,447 A | 4/1988 | Suzuki et al. | 430/321 |
| 4,861,699 A | 8/1989 | Wijdenes et al. | 430/321 |
| 4,964,958 A | 10/1990 | Legierse et al. | 204/5 |
| 5,230,772 A | 7/1993 | Kadomura | 156/643 |
| 5,360,873 A | 11/1994 | Ohkawa et al. | 525/193 |
| 5,490,126 A * | 2/1996 | Furumiya et al. | 369/59.12 |
| 5,501,926 A | 3/1996 | Cheng et al. | 430/5 |
| 5,635,267 A | 6/1997 | Yamada et al. | 428/64.4 |
| 5,674,115 A | 10/1997 | Yamashita et al. | 451/289 |
| 5,939,510 A * | 8/1999 | Sato et al. | 528/128 |
| 5,948,592 A | 9/1999 | Umehara et al. | 430/270.1 |
| 6,127,100 A | 10/2000 | Shimizu | 430/320 |
| 6,238,846 B1 | 5/2001 | Tacken | 430/320 |
| 6,477,136 B2 | 11/2002 | Sakurai et al. | 369/275.4 |
| 6,562,550 B2 | 5/2003 | Takahata et al. | 430/320 |
| 6,699,643 B2 | 3/2004 | Asukata | 430/315 |
| 6,874,262 B2 | 4/2005 | Nishiyama et al. | 40/321 |
| 6,927,016 B2 | 8/2005 | Sano | 430/321 |
| 2002/0160312 A1* | 10/2002 | Oyake et al. | 430/320 |
| 2003/0063553 A1 | 4/2003 | Oyake et al. | 369/272 |
| 2003/0170564 A1 | 9/2003 | Kido et al. | 430/270.11 |
| 2004/0259039 A1* | 12/2004 | Oyake et al. | 430/320 |
| 2005/0006336 A1* | 1/2005 | Takahata et al. | 216/22 |
| 2005/0039621 A1* | 2/2005 | Oyake et al. | 101/483 |
| 2005/0042427 A1* | 2/2005 | Oyake et al. | 428/195.1 |
| 2005/0065345 A1 | 3/2005 | Tsuchida et al. | 546/225 |
| 2005/0066825 A1* | 3/2005 | Oyake et al. | 101/32 |
| 2005/0074701 A1* | 4/2005 | Tsukuda et al. | 430/320 |
| 2005/0118534 A1* | 6/2005 | Oyake et al. | 430/321 |
| 2005/0232130 A1* | 10/2005 | Oyake et al. | 369/275.4 |

FOREIGN PATENT DOCUMENTS

| | | | |
|---|---|---|---|
| JP | 53-123095 | | 10/1978 |
| JP | 57-172736 | | 10/1982 |
| JP | 59-093448 | | 5/1984 |
| JP | 01-286144 | * | 11/1989 |
| JP | 2-198835 | | 8/1990 |
| JP | 3-180476 | | 8/1991 |
| JP | 4-263140 | | 9/1992 |
| JP | 04-263140 | * | 9/1992 |
| JP | 4-263141 | | 9/1992 |
| JP | 5-214547 | | 8/1993 |
| JP | 05-290412 | * | 11/1993 |
| JP | 6-060436 | | 3/1994 |
| JP | 6-150392 | | 5/1994 |
| JP | 6-182346 | | 7/1994 |
| JP | 6-215422 | | 8/1994 |
| JP | 7-147026 | | 6/1995 |
| JP | 8-062835 | | 3/1996 |
| JP | 8-185643 | | 7/1996 |
| JP | 8-273219 | | 10/1996 |
| JP | 8-283950 | | 10/1996 |
| JP | 8-315425 | | 11/1996 |
| JP | 9-109276 | | 4/1997 |
| JP | 9-171952 | | 6/1997 |
| JP | 09-231569 | * | 9/1997 |
| JP | 09237420 | | 9/1997 |
| JP | 9-292715 | | 11/1997 |
| JP | 9-306893 | | 11/1997 |
| JP | 10-134425 | | 5/1998 |
| JP | 10-188285 | * | 7/1998 |
| JP | 10-204328 | | 8/1998 |
| JP | 10-241213 | | 9/1998 |
| JP | 10-334468 | * | 12/1998 |
| JP | 11-084673 | | 3/1999 |
| JP | 2000-021033 | | 1/2000 |
| JP | 2000-040267 | | 2/2000 |
| JP | 2000-113520 | | 4/2000 |
| JP | 2000-113526 | | 4/2000 |
| JP | 2000-137324 | | 5/2000 |
| JP | 2000-280255 | | 10/2000 |
| JP | 2000276780 | | 10/2000 |
| JP | 2000276782 | | 10/2000 |
| JP | 2001-126309 | | 5/2001 |
| JP | 2001-148122 | | 5/2001 |
| JP | 2001-184734 | | 7/2001 |
| JP | 2001-202661 | | 7/2001 |
| JP | 2001-232943 | | 8/2001 |
| JP | 2001-344831 | | 12/2001 |
| JP | 2001-357571 | | 12/2001 |
| JP | 2002-050043 | | 2/2002 |
| JP | 2002-050087 | | 2/2002 |
| JP | 2002-056539 | | 2/2002 |
| JP | 2002-072489 | | 3/2002 |
| JP | 2002-117578 | | 4/2002 |
| JP | 2002-117579 | | 4/2002 |
| JP | 2002-117588 | | 4/2002 |
| WO | 96/32521 | | 10/1996 |
| WO | 02/069336 | * | 9/2002 |

\* cited by examiner

PROCESSING METHOD FOR PHOTORESIST MASTER, PRODUCTION METHOD FOR RECORDING MEDIUM-USE MATER, PRODUCTION METHOD FOR RECORDING MEDIUM, PHOTORESIST MASTER, RECORDING MEDIUM-USE MASTER AND RECORDING MEDIUM

BACKGROUND OF THE INVENTION

The present invention relates to a method for processing a photoresist-coated glass board, a method for manufacturing a stamper for a recording medium, a method for manufacturing a recording medium, a photoresist-coated glass board, a stamper for a recording medium and a recording medium and, particularly, to a method for processing a photoresist-coated glass board to manufacture a stamper for a recording medium such as an optical recording disk accurately formed with pre-pits.

DESCRIPTION OF THE PRIOR ART

The kind of recording medium known as an "optical recording disk" is manufactured by employing an optical recording disk stamper formed with a negative pattern of pits or guide grooves for tracking and transferring the negative pattern of pits or guide grooves for tracking onto the optical recording disk by an injection molding process or photo-setting process. The negative pattern of the stamper is formed by projecting a laser beam onto a photo-sensitive layer formed by applying a photo-sensitive material onto a glass substrate, thereby exposing the photo-sensitive layer to the laser beam, applying a metal film made of nickel or the like onto a raised and depressed pattern formed at regions of the exposed photo-sensitive layer, effecting thick film plating using the metal film as a base, and peeling off the photo-sensitive layer from the metal film.

FIG. 7 is a diagram showing a process for manufacturing a stamper for an optical recording disk using a cutting machine 100. As shown in FIG. 7, a laser beam 102 emitted from a laser device 101 enters an EOM (electro-optic modulator) 103, whereby the power of the laser beam 102 is modulated to a predetermined power suitable for exposure and is reflected by a beam splitter 104, a beam splitter 105 and a mirror 106 to be condensed by a lens 107a onto a photoresist-coated board 108. When a stamper for a DVD is to be fabricated, a laser beam 102 having a wavelength λ of about 351 nm is employed.

The photoresist-coated board 108 has a disk-like shape and includes a glass substrate 108a and a photosensitive material layer 108c formed on the glass substrate 108a. The photosensitive material layer 108c is irradiated with a laser beam 102 to be exposed thereto and developed to form a raised and depressed pattern composed of grooves or pre-pits.

A lens 107b for condensing the laser 102, a light modulator 109 and a lens 107c for making the laser beam whose power has been modulated into a parallel beam are disposed between the beam splitter 104 and the beam splitter 105 and the power of the laser beam 102 is modulated in accordance with an input pulse signal train. In such a case, the power of the laser beam 102 is modulated intermittently in accordance with the length of the pre-pits to be formed. For example, as disclosed in Japanese Patent Application Laid Open No. 2000-276780, the length of a pulse for end portions of the pit is set longer than that for a central portion of the pit and the length of a pulse following a foremost pulse and the length of a pulse preceding a last pulse are set longer than that at the central portion. Pre-pits each having a uniform width can be formed by modulating the power of the laser beam 102 in this manner, thereby improving jitter property and modulation of the reproduced signal.

A latent image of a raised and depressed pattern corresponding to pre-pits is formed spirally on the photoresist-coated board 108 by integrally moving the mirror 106 and an objective lens 107a in a radial direction of the photoresist-coated board 108 and rotating a turn table 110 on which the photoresist-coated board 108 is placed, and the raised and depressed pattern is formed on the photoresist-coated board 108 by developing the photoresist-coated board 108.

A nickel film is formed by plating and electrotyping on the photoresist-coated board 108 on which the raised and depressed pattern corresponding to the pre-pits is formed in this manner and the photoresist-coated board 108 is peeled off from the nickel film, thereby fabricating a stamper.

Recently, the recording density of data in an optical recording disk has been increased. For example, although the track pitch of a DVD is set to 0.74 μm and the shortest pit length thereof is set to 0.4 μm, in a next-generation type optical recording disk having an extremely high data transfer rate, it is required to set the track pitch and the shortest pit length thereof to about 0.32 μm and 0.16 μm, respectively. In accordance with this trend, it is required to set the wavelength λ of the laser beam used for reproducing data from the optical recording disk to about 405 nm, i.e., shorter than the 650 nm wavelength of the laser beam used for the conventional optical recording disk.

A stamper for producing such an optical recording disk is difficult to fabricate using a conventional cutting machine employing a laser beam having a wavelength λ of 351 nm. Specifically, in the case where a stamper is fabricated using the conventional cutting machine employing a laser beam having a wavelength λ of 351 nm and only modulating the laser beam to an intermittent beam, the width of the raised and depressed patterns cannot be made uniform for forming raised and depressed patterns having various widths corresponding to a short pit to a long pit, making it impossible to narrow the track pitch.

Although it is possible to form the pits of such an optical recording disk by using a cutting machine employing a laser beam having a shorter wavelength, such a cutting machine is expensive and it is desirable to fabricate a stamper for the next-generation type optical recording disk using an existing cutting machine.

SUMMARY OF THE INVENTION

It is therefore an object of the present invention to provide a method for processing a photoresist-coated board which can form a fine raised and depressed pattern having a uniform width after development even in the case where a laser beam having a relatively long wavelength is used, and a photoresist-coated board formed with a fine raised and depressed pattern having a uniform width.

It is another object of the present invention to provide a method for manufacturing a stamper for a recording medium such as an optical recording disk or the like which can make pit widths of pre-pits uniform irrespective of the pit lengths and narrow a track pitch even in the case where a laser beam having a relatively long wavelength is used and a stamper for a recording medium such as an optical recording disk or the like formed with pre-pits having uniform pit widths and a narrow track pitch.

It is a further object of the present invention to provide a method for manufacturing a recording medium such as an optical recording disk or the like which can make pit widths of pre-pits uniform irrespective of the pit lengths and narrow a track pitch even in the case where a laser beam having a relatively long wavelength is used and a recording medium such as an optical recording disk or the like formed with pre-pits having uniform pit widths and a narrow track pitch.

The above objects of the present invention can be accomplished by a method for processing a photoresist-coated board comprising steps of intermittently projecting a pulse-like laser beam onto a photosensitive material layer on or above a light absorption layer provided in the photoresist-coated board to expose the photosensitive material layer to the laser beam, and developing the photosensitive material layer, thereby forming a raised and depressed pattern on the photosensitive material layer.

According to the present invention, since a laser beam is intermittently projected onto a photoresist-coated board formed with a light absorption layer, a fine raised and depressed pattern having a uniform width can be formed on the photoresist-coated board after development even in the case where a laser beam having a relatively long wavelength is used. Therefore, a stamper for a recording medium and a recording medium formed with fine pre-pits having a uniform width can be fabricated.

In a preferred aspect of the present invention, a duty ratio of the pulse-like laser beam is varied in accordance with a length of a depressed portion or a projecting portion of the raised and depressed pattern to be formed.

According to this preferred aspect of the present invention, since the laser beam is intermittently projected onto the photoresist-coated board while the duty ratio thereof is varied, a fine raised and depressed pattern having a uniform width can be formed on the photoresist-coated board after development even in the case where a laser beam having a relatively long wavelength is used. Therefore, a stamper for a recording medium and a recording medium formed with fine pre-pits having a uniform width can be fabricated.

The above objects of the present invention can be also accomplished by a method for processing a photoresist-coated board comprising steps of intermittently projecting a pulse-like laser beam onto a photosensitive material layer provided in the photoresist-coated board to expose the photosensitive material layer to the laser beam, and developing the photosensitive material layer, thereby forming a raised and depressed pattern on the photosensitive material layer, wherein the method for processing a photoresist-coated board further comprises a step of varying a duty ratio of the pulse-like laser beam in accordance with a length of a depressed portion or a projecting portion of the raised and depressed pattern to be formed.

According to the present invention, since the laser beam is intermittently projected onto the photoresist-coated board while the duty ratio thereof is varied, a fine raised and depressed pattern having a uniform width can be formed on the photoresist-coated board after development even in the case where a laser beam having a relatively long wavelength is used. Therefore, a stamper for a recording medium and a recording medium formed with fine pre-pits having a uniform width can be fabricated.

In a preferred aspect of the present invention, when a length of a depressed portion or a projecting portion of the raised and depressed pattern is shorter than a predetermined length, the duty ratio of the pulse-like laser beam is varied in accordance with the length of the depressed portion or the projecting portion of the raised and depressed pattern and when a length of a depressed portion or a projecting portion of the raised and depressed pattern is equal to or longer than a predetermined length, the duty ratio of the pulse-like laser beam is kept constant independently of the length of the depressed portion or the projecting portion of the raised and depressed pattern, thereby exposing the photosensitive material layer to the laser beam.

According to this preferred aspect of the present invention, since the duty ratio of the pulse-like laser beam is varied only when it is particularly difficult to form a fine raised and depressed pattern having a uniform width without varying the duty ratio of the pulse-like laser beam for forming a depressed portion or a projecting portion of the raised and depressed pattern having a length shorter than a predetermined length, it is possible to form the raised and depressed pattern on the photoresist-coated board so as to be fine and have a uniform width without conducting complicated operations. Therefore, a stamper for a recording medium and a recording medium formed with fine pre-pits having a uniform width can be fabricated.

In a further preferred aspect of the present invention, the duty ratio of the pulse-like laser beam is varied so that the photosensitive material layer is exposed to the laser beam by setting the duty ratio of the pulse-like laser beam to a first value when a depressed portion or a projecting portion of a raised and depressed pattern having a first length is to be formed and that the photosensitive material layer is exposed to the laser beam by setting the duty ratio of the pulse-like laser beam to a second value smaller than the first value when a depressed portion or a projecting portion of a raised and depressed pattern having a second length longer than the first length is to be formed.

According to this preferred aspect of the present invention, since the laser beam having a smaller duty ratio is intermittently projected onto the photoresist-coated board when the length of the depressed portion or projecting portion of the raised and depressed pattern becomes greater, a fine raised and depressed pattern having a uniform width can be formed on the photoresist-coated board after development irrespective of the length of the depressed portion or projecting portion of the raised and depressed pattern even in the case where a laser beam having a relatively long wavelength is used. Therefore, a stamper for a recording medium and a recording medium formed with fine pre-pits having a uniform width can be fabricated.

The above objects of the present invention can be also accomplished by a method for manufacturing a stamper for a recording medium comprising a step of intermittently projecting a pulse-like laser beam onto a photosensitive material layer on or above a light absorption layer provided in the photoresist-coated board to expose the photosensitive material layer to the laser beam, and developing the photosensitive material layer, thereby forming a raised and depressed pattern on the photosensitive material layer and a step for transferring the raised and depressed pattern formed on the photosensitive material layer onto the stamper for a recording medium, thereby forming a raised and depressed pattern on the stamper for an optical recording medium.

According to the present invention, since a laser beam is intermittently projected onto a photoresist-coated board formed with a light absorption layer, a fine raised and depressed pattern having a uniform width can be formed on the photoresist-coated board after development even in the case where a laser beam having a relatively long wavelength is used. Therefore, a recording medium formed with fine pre-pits having a uniform width can be fabricated.

The above objects of the present invention can be also accomplished by a method for manufacturing a stamper for a recording medium comprising a step of forming a raised and depressed pattern including a depressed portion or a projecting portion corresponding to a pit on a photosensitive material layer on or above a light absorption layer provided in a photoresist-coated board by projecting two or more pulses of a laser beam onto the photosensitive material layer to expose the photosensitive material layer thereto and developing the photosensitive material layer, and a step of transferring the raised and depressed pattern formed on the photosensitive material layer onto a stamper for a recording medium and forming a raised and depressed pattern on the stamper. Here, "two pulses" means two intermittent pulses.

According to the present invention, since two or more pulses of a laser beam are projected onto the photoresist-coated board having the light absorption layer, a fine raised and depressed pattern having a uniform width can be formed on the photoresist-coated board after development even in the case where a laser beam having a relatively long wavelength is used. Therefore, a recording medium formed with fine pre-pits having a uniform width can be fabricated.

In a preferred aspect of the present invention, a duty ratio of the pulse-like laser beam is varied in accordance with a length of a depressed portion or a projecting portion of the raised and depressed pattern to be formed.

According to this preferred aspect of the present invention, since the laser beam is intermittently projected onto the photoresist-coated board while the duty ratio thereof is varied, a fine raised and depressed pattern having a uniform width can be formed on the photoresist-coated board after development even in the case where a laser beam having a relatively long wavelength is used. Therefore, a recording medium formed with fine pre-pits having a uniform width can be fabricated.

The above objects of the present invention can be also accomplished by a method for manufacturing a stamper for a recording medium comprising a step of forming a raised and depressed pattern on a photosensitive material layer provided in a photoresist-coated board by intermittently projecting a pulse-like laser beam onto the photosensitive material layer to expose the photosensitive material layer thereto and developing the photosensitive material layer, and a step of transferring the raised and depressed pattern formed on the photosensitive material layer onto a stamper for a recording medium and forming a raised and depressed pattern on the stamper, wherein the method for manufacturing a stamper for a recording medium further comprises a step of varying a duty ratio of the pulse-like laser beam in accordance with a length of a depressed portion or a projecting portion of the raised and depressed pattern to be formed.

According to the present invention, since the laser beam is intermittently projected onto the photoresist-coated board while the duty ratio thereof is varied, a fine raised and depressed pattern having a uniform width can be formed on the photoresist-coated board after development even in the case where a laser beam having a relatively long wavelength is used. Therefore, a recording medium formed with fine pre-pits having a uniform width can be fabricated.

In a preferred aspect of the present invention, when a length of a depressed portion or a projecting portion of the raised and depressed pattern is shorter than a predetermined length, the duty ratio of the pulse-like laser beam is varied in accordance with the length of the depressed portion or the projecting portion of the raised and depressed pattern and when a length of a depressed portion or a projecting portion of the raised and depressed pattern is equal to or longer than a predetermined length, the duty ratio of the pulse-like laser beam is kept constant independently of the length of the depressed portion or the projecting portion of the raised and depressed pattern, thereby exposing the photosensitive material layer to the laser beam.

According to this preferred aspect of the present invention, since the duty ratio of the pulse-like laser beam is varied only when it is particularly difficult to form a fine raised and depressed pattern having a uniform width without varying the duty ratio of the pulse-like laser beam for forming a depressed portion or a projecting portion of the raised and depressed pattern having a length shorter than a predetermined length, it is possible to form the raised and depressed pattern on the photoresist-coated board so as to be fine and have a uniform width without conducting complicated operations. Therefore, a recording medium formed with fine pre-pits having a uniform width can be fabricated.

In a further preferred aspect of the present invention, the duty ratio of the pulse-like laser beam is varied so that the photosensitive material layer is exposed to the laser beam by setting the duty ratio of the pulse-like laser beam to a first value when a depressed portion or a projecting portion of a raised and depressed pattern having a first length is to be formed and that the photosensitive material layer is exposed to the laser beam by setting the duty ratio of the pulse-like laser beam to a second value smaller than the first value when a depressed portion or a projecting portion of a raised and depressed pattern having a second length longer than the first length is to be formed.

According to this preferred aspect of the present invention, since the laser beam having a smaller duty ratio is intermittently projected onto the photoresist-coated board when the length of the depressed portion or projecting portion of the raised and depressed pattern becomes greater, a fine raised and depressed pattern having a uniform width can be formed on the photoresist-coated board after development irrespective of the length of the depressed portion or projecting portion of a raised and depressed pattern even in the case where a laser beam having a relatively long wavelength is used. Therefore, a recording medium formed with fine pre-pits having a uniform width can be fabricated.

The above objects of the present invention can be also accomplished by a method for manufacturing a recording medium comprising at least a step of forming a raised and depressed pattern including a depressed portion or a projecting portion corresponding to a pit on a photosensitive material layer on or above a light absorption layer provided in a photoresist-coated board by projecting two or more pulses of a laser beam onto the photosensitive material layer to expose the photosensitive material layer thereto and developing the photosensitive material layer, a step of transferring the raised and depressed pattern formed on the photosensitive material layer onto a stamper for a recording medium and forming a raised and depressed pattern on the stamper, and a step of transferring the raised and depressed pattern formed on the stamper onto a substrate for a recording medium to form pre-pits on the substrate.

According to the present invention, since two or more pulses of a laser beam are projected onto the photoresist-coated board having the light absorption layer, a fine raised and depressed pattern having a uniform width can be formed on the photoresist-coated board after development even in the case where a laser beam having a relatively long wavelength is used.

According to this preferred aspect of the present invention, since the laser beam is intermittently projected onto the photoresist-coated board while the duty ratio thereof is varied, a fine raised and depressed pattern having a uniform width can be formed on the photoresist-coated board after development even in the case where a laser beam having a relatively long wavelength is used.

The above objects of the present invention can be also accomplished by a method for manufacturing a recording medium comprising at least a step of forming a raised and depressed pattern including a depressed portion or a projecting portion corresponding to a pit on a photosensitive material layer provided in a photoresist-coated board by projecting two or more pulses of a laser beam onto the photosensitive material layer to expose the photosensitive material layer thereto and developing the photosensitive material layer, a step of transferring the raised and depressed pattern formed on the photosensitive material layer onto a stamper for an optical recording medium and forming a raised and depressed pattern on the stamper, and a step of transferring the raised and depressed pattern formed on the stamper onto a substrate for a recording medium to form pre-pits on the substrate, wherein the method for manufacturing a recording medium further comprises a step of varying a duty ratio of the pulse-like laser beam in accordance with a length of a pre-pit to be formed.

According to the present invention, since the laser beam is intermittently projected onto the photoresist-coated board while the duty ratio thereof is varied, a fine raised and depressed pattern having a uniform width can be formed on the photoresist-coated board after development even in the case where a laser beam having a relatively long wavelength is used.

In a preferred aspect of the present invention, when a length of a pre-pit is shorter than a predetermined length, the duty ratio of the pulse-like laser beam is varied in accordance with the length of the pre-pit and when a length of a pre-pit is equal to or longer than a predetermined length, the duty ratio of the pulse-like laser beam is kept constant independently of the length of the pre-pit, thereby exposing the photosensitive material layer to the laser beam.

According to this preferred aspect of the present invention, since the duty ratio of the pulse-like laser beam is varied only when it is particularly difficult to form a fine raised and depressed pattern having a uniform width without varying the duty ratio of the pulse-like laser beam for forming a depressed portion or a projecting portion of the raised and depressed pattern having a length shorter than a predetermined length, it is possible to form the raised and depressed pattern on the photoresist-coated board so as to be fine and have a uniform width without conducting complicated operations.

In a further preferred aspect of the present invention, the duty ratio of the pulse-like laser beam is varied so that the photosensitive material layer is exposed to the laser beam by setting the duty ratio of the pulse-like laser beam to a first value when a pre-pit having a first length is to be formed and that the photosensitive material layer is exposed to the laser beam by setting the duty ratio of the pulse-like laser beam to a second value smaller than the first value when a pre-pit having a second length longer than the first length is to be formed.

According to this preferred aspect of the present invention, since the laser beam having a smaller duty ratio is intermittently projected onto the photoresist-coated board when the length of the depressed portion or projecting portion of the raised and depressed pattern becomes greater, a fine raised and depressed pattern having a uniform width can be formed on the photoresist-coated board after development irrespective of the length of the depressed portion or projecting portion of a raised and depressed pattern even in the case where a laser beam having a relatively long wavelength is used.

The above objects of the present invention can be also accomplished by a photoresist-coated board constituted by laminating a light absorption layer and a photosensitive material layer on a substrate in this order, the photosensitive material layer being formed with a raised and depressed pattern and the raised and depressed pattern of the photosensitive material layer being formed by intermittently projecting a pulse-like laser beam onto the photosensitive material layer to expose the photosensitive material layer thereto and developing the photosensitive material layer.

According to the present invention, since the raised and depressed pattern on the photoresist-coated board is fine and has a uniform width, it is possible to manufacture a stamper for a recording medium and a recording medium formed with a fine raised and depressed pattern having a uniform width using the photoresist-coated board.

In a preferred aspect of the present invention, the raised and depressed pattern of the photosensitive material layer is formed by intermittently projecting on the photosensitive material layer the pulse-like laser beam whose duty ratio is varied in accordance with a length of a depressed portion or a projecting portion of the raised and depressed pattern and developing the photosensitive material layer.

According to this preferred aspect of the present invention, since the raised and depressed pattern on the photoresist-coated board is fine and has a uniform width, it is possible to manufacture a stamper for a recording medium and a recording medium formed with a fine raised and depressed pattern having a uniform width using the photoresist-coated board.

The above objects of the present invention can be also accomplished by a photoresist-coated board constituted by laminating a photosensitive material layer on a substrate, the photosensitive material layer being formed with a raised and depressed pattern and the raised and depressed pattern of the photosensitive material layer being formed by intermittently projecting a pulse-like laser beam onto the photosensitive material layer to expose the photosensitive material layer thereto and developing the photosensitive material layer.

According to the present invention, since the raised and depressed pattern on the photoresist-coated board is fine and has a uniform width, it is possible to manufacture a stamper for a recording medium and a recording medium formed with a fine raised and depressed pattern having a uniform width using the photoresist-coated board.

The above objects of the present invention can be also accomplished by a stamper for a recording medium having a raised and depressed pattern formed by transferring the raised and depressed pattern of one of the aforesaid photoresist-coated boards thereonto.

According to this preferred aspect of the present invention, since the laser beam is intermittently projected onto the photoresist-coated board, a fine raised and depressed pattern having a uniform width can be formed in the photoresist-coated board after development even in the case where a laser beam having a relatively long wavelength is used. Therefore, a recording medium formed with fine pre-pits having a uniform width can be fabricated.

The above objects of the present invention can be also accomplished by a recording medium having pre-pits formed by transferring the raised and depressed pattern of the stamper for a recording medium thereonto.

According to the present invention, it is possible to make a pit-width of the pre-pits formed on the recording medium uniform and narrow a track pitch.

DESCRIPTION OF THE PREFERRED EMBODIMENT

A preferred embodiment of the present invention will now be described with reference to the accompanying drawings.

Figure 1:
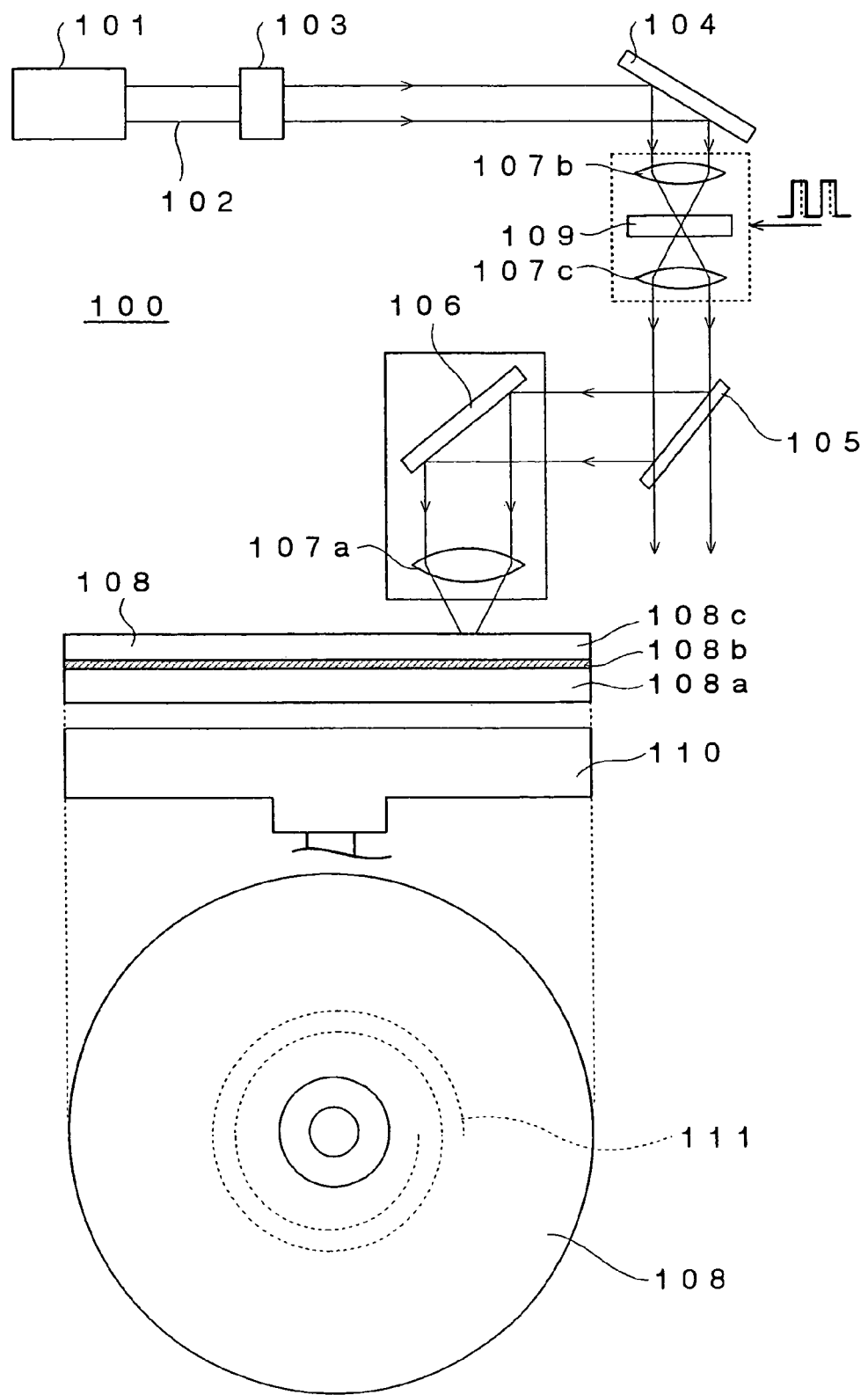
FIG. 1 is a diagram showing the principle of a method for manufacturing a stamper for an optical recording disk which is a preferred embodiment of the present invention.

FIG. 1 is a diagram showing the principle of a method for manufacturing a stamper for an optical recording disk which is a preferred embodiment of the present invention. As shown in FIG. 1, a laser beam 102 emitted from a laser beam source 101 such as a krypton laser beam source enters an EOM (electro-optic modulator) 103, whereby the power thereof is modulated to a predetermined power suitable for exposure and is reflected by a beam splitter 104, a beam splitter 105 and a mirror 106 to be condensed by a lens 107a onto a photoresist-coated glass board 108.

The photoresist-coated glass board 108 has a disk-like shape and is constituted by laminating a light absorption layer 108b and a photosensitive material layer 108c on a glass substrate 108a in this order and the laser beam 102 is condensed onto the photosensitive material layer 108c, whereby the photosensitive material layer 108c is exposed to the laser beam 102 and a latent image of a raised and depressed pattern corresponding to pre-pits is formed therein.

The light absorption layer 108b preferably contains an organic compound having a light absorbency (sometimes referred to as "a light absorbent agent"). It is preferable to use at least one kind of a compound selected from a photo-initiator and a dye as the light absorbent agent. Generally, a photo-initiator is used together with a photo-curable resin and has a property of generating a radical upon absorbing light such as an ultraviolet ray. Further, it is preferable to incorporate a photo-initiation auxiliary agent that itself does not become activated but serves to promote photo-chemical reaction when used together with the photo-initiator, as compared with the case where the photo-initiator is used alone, whereby the photo-chemical reaction efficiently proceeds. The photo-initiator is decomposed when it generates a radical but the photo-initiation auxiliary agent remains stable. It is therefore preferable to use a photo-initiation auxiliary agent in the present invention.

As a photo-initiation auxiliary agent, aliphatic amine or aromatic amine is mainly used. In the present invention, it is preferable to employ as a photo-initiation auxiliary agent at least one kind of a compound selected from 4, 4'-bis (dimethylamino) benzophenone, 4, 4'-bis (diethylamino) benzophenone, 4-dimethylamino amyl benzoate, 4-dimethylamino (n-butoxy) ethyl benzoate, 4-dimethylamino isoamyl benzoate and 4-dimethylamino 2-ethylhexyl benzoate. Among these, it is preferable to employ a benzophenone system compound.

It is preferable to form a light absorption layer containing a light absorbent agent in the following manner. A light absorbent agent is first dissolved in a solvent to prepare a coating solution. A thermo-crosslinking compound may be added to the coating solution together with the light absorbent agent as occasion demands. If a coating layer containing the thermo-crosslinking compound in addition to the light absorbent agent is formed, the coating layer is heated to be hardened and a photo-resist layer is formed on the thus hardened coating layer, it is possible to prevent the light absorption layer and the photo-resist layer from mixing. Further, various additives such as an adhesion auxiliary agent for improving adhesiveness with the photo-resist layer, a light absorbance agent, a surface active surfactant and the like may be added to the coating solution as occasion demands.

The content of the light absorbent agent in the light absorption layer is preferably 10 to 70 weight %. When the content of the light absorbent agent is too small, it is difficult to achieve a sufficient light absorbance. On the other hand, when the content of the light absorbent agent is too large, the content of the material produced by the hardening of thermo-crosslinking compound becomes small, so that a light absorption layer having sufficient strength cannot be formed. The light absorption layer preferably has an absorption (extinction) coefficient k equal to or higher than 0.01 in the range of the wavelength of the laser beam used for fabricating the stamper and more preferably has an absorption (extinction) coefficient k equal to or higher than 0.1. When the absorption coefficient k is too small, the laser beam cannot be sufficiently absorbed by the light absorption layer.

The thickness of the light absorption layer is not particularly limited and the light absorption layer is formed so as to have such a thickness that the laser beam used for exposing the photoresist layer can be sufficiently absorbed thereby. When the light absorption layer is too thin, it cannot absorb a sufficient amount of the laser beam and the photoresist layer tends to be multiply exposed, whereby a latent image having a desired shape cannot be formed. On the other hand, formation of the light absorption layer to a thickness larger than 300 nm does not markedly improve the light absorbance property, so that it is unnecessary to form the light absorption layer to a thickness larger than 300 nm. Further, when the light absorption layer is formed so as to have a thickness larger than 300 nm, excessive heat is accumulated in the light absorption layer when a laser beam is projected thereonto, whereby the photoresist layer tends to be thermally decomposed so that it becomes difficult to stably expose the photoresist layer. Therefore, the thickness of the light absorption layer is preferably 1 nm to 300 nm and more preferably 10 nm to 200 nm. However, since the degree of the thermal decomposition of the photoresist layer caused by the heat accumulation in the light absorption layer varies depending upon the power of the laser beam projected onto the light absorption layer, in the case where the photoresist layer is exposed to a laser beam having relatively low power, it is possible to form the light absorption layer so as to have a thickness larger than 300 nm and equal to or smaller than 500 nm, for example.

A lens 107b for condensing the laser 102, a light modulator 109 and a lens 107c for making the laser beam whose power has been modulated into a parallel beam are disposed between the beam splitter 104 and the beam splitter 105 and the power of the laser beam 102 is modulated in accordance with an input pulse signal train. Therefore, the laser beam is modulated into intermittent pulses having a predetermined duty ratio. Here, the duty ratio is defined as the ratio of the pulse width of the pulse-like laser beam (pulse laser) to the cycle of repetition of pulses.

A latent image of pre-pits 110 is formed spirally on the photoresist-coated glass board 108 by integrally moving the mirror 106 and an objective lens 107a in a radial direction of the photoresist-coated glass board 108 and rotating a turn table 110 on which the photoresist-coated glass board 108 is placed.

FIGS. 2(a) to 2(f) show steps for manufacturing a stamper for an optical recording disk. The photoresist-coated glass board 108 includes the glass substrate 108a, the light absorption layer 108b formed on the glass substrate 108a and the photosensitive material layer 108c formed on the light absorption layer 108b. Although not shown in Figures, the photoresist-coated glass board 108 may include an adhesive layer (primer) for improving adhesiveness between the glass substrate 108a and the light absorption layer 108b (FIG. 2(a)).

Figure 2:
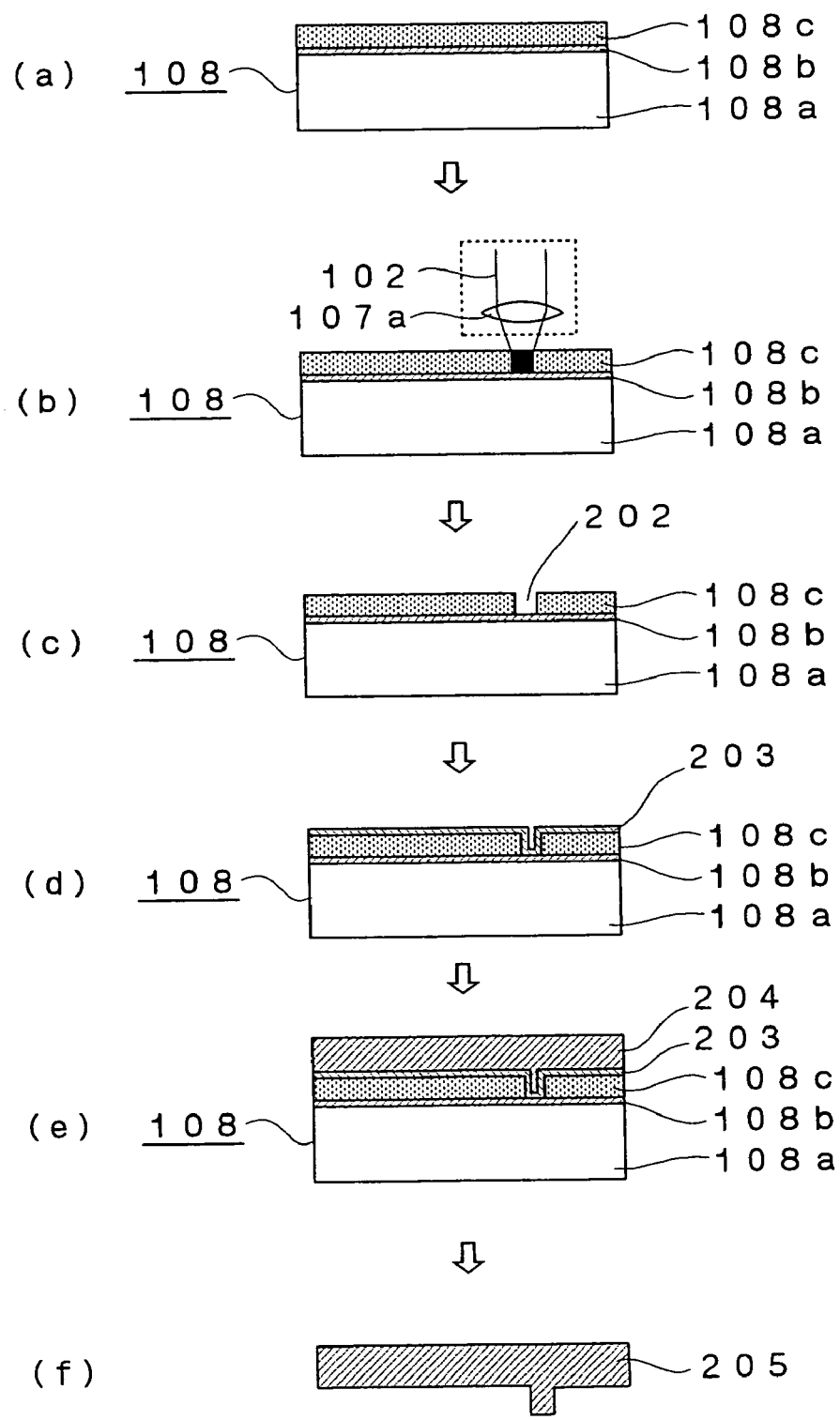
FIGS. 2(a) to 2(f) show steps for manufacturing a stamper for an optical recording disk.

When the laser beam 102 is condensed by the lens 107a onto the photosensitive material layer 108c of the photoresist-coated glass board 108, a region of the photosensitive material layer 108c irradiated with the laser beam 102 is exposed to the laser beam 102 (FIG. 2(b)). Thereby, a latent image of a raised and depressed pattern corresponding to a pre-pit is formed. At this time, the power of the laser beam 102 is modulated by the light modulator 109. After the exposure of the photoresist-coated glass board 108, a developing solution such as a sodium hydroxide solution is sprayed on the photoresist-coated glass board 108, whereby the raised and depressed pattern 202 is developed (FIG. 2(c)).

After the photoresist-coated glass board 108 has been exposed to the laser beam 102 and developed, a thin nickel film 203 is formed on the photosensitive material layer 108c using an electroless deposition process or a vapor deposition process (FIG. 2(d)). Thereafter, a thick nickel film 204 having a thickness of about 0.3 mm is formed by thick plating using the thin nickel film 203 as a positive electrode and nickel as a negative electrode (FIG. 2(e)).

After forming the thick nickel film 204, the resist surface is peeled off from the thin nickel film 203, a laminate of the thin nickel film 203 and the thick nickel film 204 is washed and processed to desired inner and outer diameters, thereby fabricating a stamper 205 for an optical recording disk (FIG. 2(f)). Optical recording disks can be mass-produced by using the thus fabricated stamper 205 and transferring the raised and depressed pattern on the optical recording disk by an injection molding process, a 2P process or the like.

Here, the number of kinds of the raised and depressed pattern 202 is determined by the modulation code used for the optical recording disk to be manufactured. While other possibilities also exist, in the case where a (1, 7)RLL Modulation Code is used for a next-generation type optical recording disk having an extremely high data transfer rate, since pre-pits having lengths of 2 T to 8 T are used, the number of kinds of the raised and depressed pattern 202 is seven, i.e., 2 T to 8 T.

Figure 3:
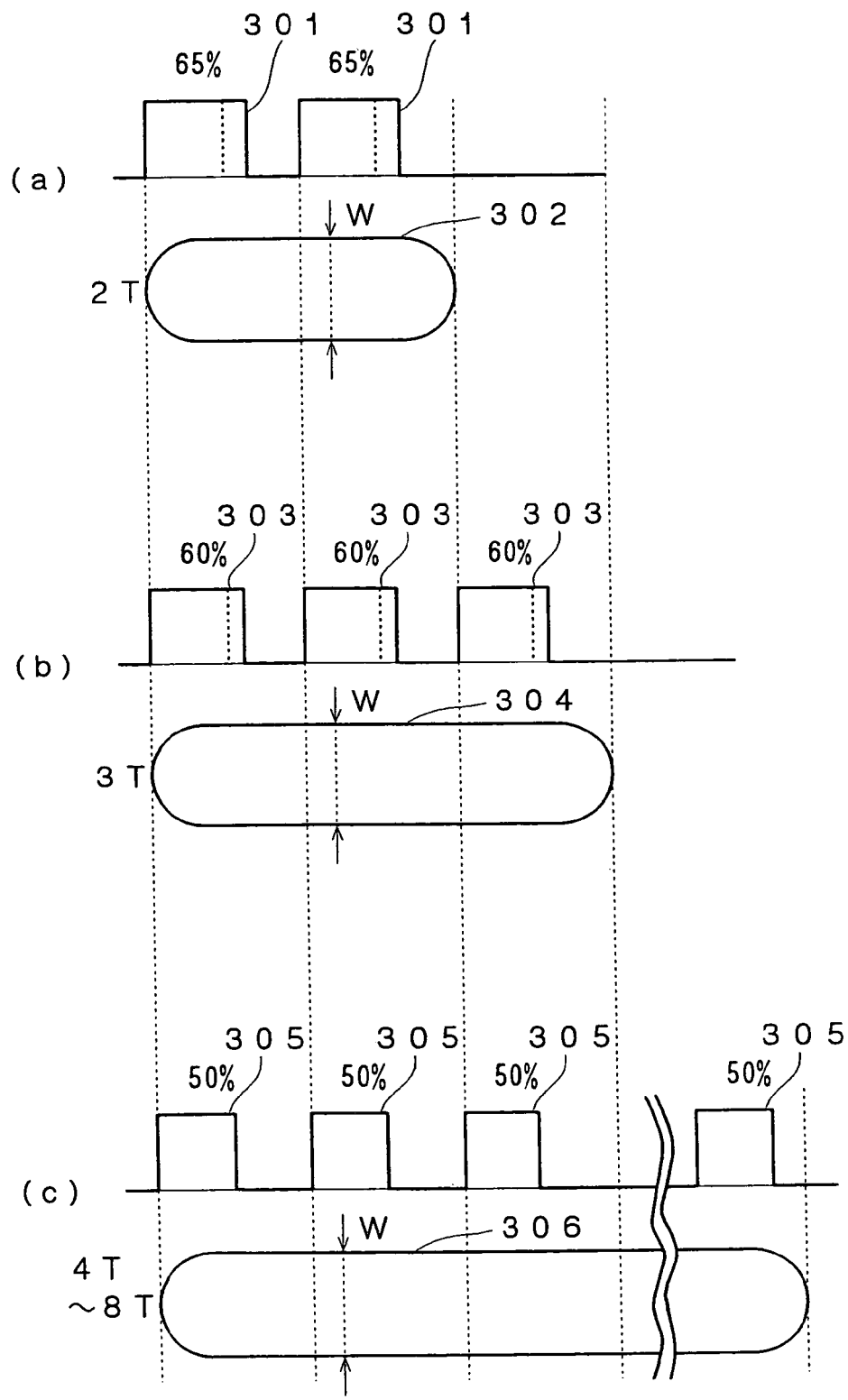
FIGS. 3(a)-3(c) are diagrams showing a pulse signal train input to a light modulator 109 and a plan view of a raised and depressed pattern 202 formed thereby on a photoresist-coated glass board 108.

Each of FIG. 3(a) to 3(c) is a diagram showing a pulse signal train input to a light modulator 109 and a plan view of a depressed portion or a projecting portion 202 of a raised and depressed pattern formed thereby on a photoresist-coated glass board 108. As shown in FIG. 3, in the case where a depressed portion or a projecting portion of a raised and depressed pattern corresponding to pre-pits having lengths of 2 T to 8 T is to be formed, when the length of a pre-pit to be formed is shorter than 4 T, for example, the duty ratio of the pulse signal train input to the light modulator 109 is varied within a range from about 30% to 80%, preferably, about 50% to 65% so that a pulse signal train having a higher duty ratio is generated as the length of a pre-pit to be formed becomes longer and the power of a laser beam is modulated by the thus generated pulse signal train. On the other hand, when the length of a pre-pit to be formed is equal to or longer than 4 T, for example, it is preferable to generate a pulse signal train having a constant duty ratio independently of the length of the pre-pit to be formed and modulate the power of the laser beam using the thus generated pulse signal train.

For example, in the case where a pre-pit having a length of 2 T is to be formed, pulse signals 301 of two clock cycles having a duty ratio of about 65% are used and a depressed portion or a projecting portion 302 of a raised and depressed pattern corresponding to a pre-pit having a length of 2 T is formed (FIG. 3(a)).

Further, in the case where a pre-pit having a length of 3 T is to be formed, pulse signals 303 of three clock cycles having a duty ratio of about 60% are used and a depressed portion or a projecting portion 304 of a raised and depressed pattern corresponding to a pre-pit having a length of 3 T is formed (FIG. 3(b)).

Furthermore, in the case where a pre-pit having a length of one of 4 T to 8 T is to be formed, the duty ratio of a pulse signal 305 is set to about 50% so as to form a depressed portion or a projecting portion 306 of a raised and depressed pattern corresponding to a pre-pit having a length of 4 T using the pulse signals 305 of four clock cycles, form a depressed portion or a projecting portion 306 of a raised and depressed pattern corresponding to a pre-pit having a length of 5 T using the pulse signals 305 of five clock cycles, form a raised and depressed pattern 306 corresponding to a pre-pit having a length of 6 T using the pulse signals 305 of six clock cycles, form a depressed portion or a projecting portion 306 of a raised and depressed pattern corresponding to a pre-pit having a length of 7 T using the pulse signals 305 of seven clock cycles and form a depressed portion or a projecting portion 306 of a raised and depressed pattern corresponding to a pre-pit having a length of 8 T using the pulse signals 305 of eight clock cycles (FIG. 3(c)).

Thus, if the power of the laser beam is modulated using a pulse signal train having a proper duty ratio and the thus power-modulated laser beam is projected onto the photoresist-coated glass board 108, it is possible even when using a laser beam having a relatively long wavelength to narrow the pit width w of a depressed portion or a projecting portion 302, 304, 305 of a raised and depressed pattern corresponding to a pre-pit and make it uniform independently of the length of the pre-pit and, as a result, the track pitch can be narrowed.

Here, the critical length of a pre-pit based on which it is determined whether the duty ratio of the pulse signal train should be varied or the duty ratio of the pulse signal train should be maintained constant is preferably selected so as to be substantially equal to the size of the spot of the laser beam. In the present invention, the critical length of a pre-pit is preferably determined to be 4 T but it may be determined to be 2 T, 3 T or 5 T.

Further, the above mentioned duty ratios are only illustrated as examples and it is possible to set the duty ratio of each of the pulse signals to 60% when a pre-pit having a length of 2 T is to be formed, set the duty ratio of each of the pulse signals to 55% when a pre-pit having a length of 3 T is to be formed and set the duty ratio of each of the pulse signals to 55% when a pre-pit having a length of one of 4 T to 8 T is to be formed. Insofar as the duty ratio of each pulse signal is set in the range of 50% to 65% in this manner, substantially the same advantages can be obtained. However, when a pre-pit having a length of one of 4 T to 8 T is to be formed, it is not preferable to set the duty ratio of each pulse signal too high, for example, about 60%. Furthermore, it is possible to vary the duty ratio of each pulse signal within the range of 30% to 80%, for example, in such a manner that the duty ratio of each pulse signal is set to 80% when a pre-pit having a length of 2 T is to be formed, set to 60% when a pre-pit having a length of 3 T is to be formed and set to 30% when a pre-pit having a length of one of 4 T to 8 T is to be formed.

Moreover, even in the case where a pre-pit having a length equal to or longer than a predetermined length, for example, 4 T, is to be formed, it is not absolutely necessary to maintain the duty ratio of each pulse signal constant. Even in such a case, it is possible to form a pre-pit having a length of one of 2 T to 8 T by stepwise varying the duty ratio of each pulse signal within the range of 50% to 65%, for example, in such a manner that the duty ratio of each pulse signal is set to 65% when a pre-pit having a length of 2 T is to be formed, set to 60% when a pre-pit having a length of 3 T is to be formed, set to 55% when a pre-pit having a length of 4 T is to be formed, set to 53% when a pre-pit having a length of 5 T is to be formed, set to 52% when a pre-pit having a length of 6 T is to be formed, set to 51% when a pre-pit having a length of 7 T is to be formed and set to 50% when a pre-pit having a length of 8 T is to be formed.

Furthermore, it is possible to form a pre-pit having a length of one of 2 T to 8 T by stepwise varying the duty ratio of each pulse signal within the range of 30% to 80%, for example, in such a manner that the duty ratio of each pulse signal is set to 80% when a pre-pit having a length of 2 T is to be formed, set to 65% when a pre-pit having a length of 3 T is to be formed, set to 50% when a pre-pit having a length of 4 T is to be formed, set to 45% when a pre-pit having a length of 5 T is to be formed, set to 40% when a pre-pit having a length of 6 T is to be formed, set to 35% when a pre-pit having a length of 7 T is to be formed and set to 30% when a pre-pit having a length of 8 T is to be formed.

Figure 4:
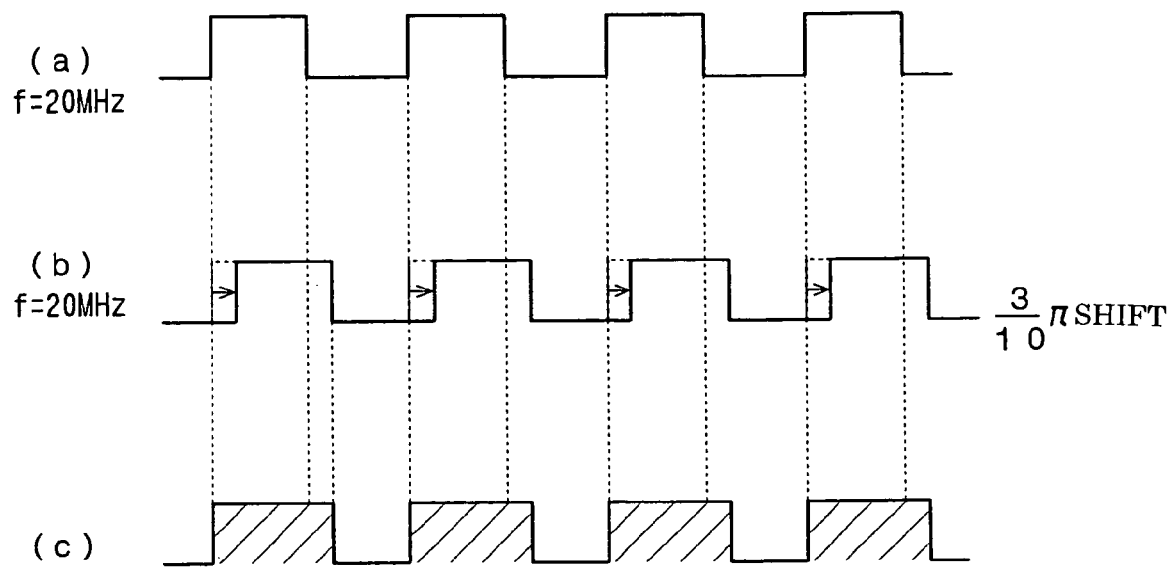
FIGS. 4(a)-(c) are diagrams showing a method for generating a pulse signal train that is a signal for modulating the power of a laser beam.

FIG. 4 is a diagram showing a method for generating a pulse signal train that is a signal for modulating the power of a laser beam. A pulse signal having a predetermined duty ratio (FIG. 4(c)) can be generated by adding a rectangular wave signal of a base clock cycle having a frequency f of 20 MHz (FIG. 2(a)) and rectangular wave signal (FIG. 4(b)) obtained by phase shifting the base clock cycle. For example, a pulse signal having a duty ratio of 65% can be generated by shifting the base clock cycle by $3\pi/10$ and adding the thus obtained rectangular wave to the rectangular wave of the base clock cycle. The base clock cycle is shifted by $\pi/5$ for generating a pulse signal having a duty ratio of 60% and is shifted by $\pi/10$ for generating a pulse signal having a duty ratio of 55%.

Figure 5:
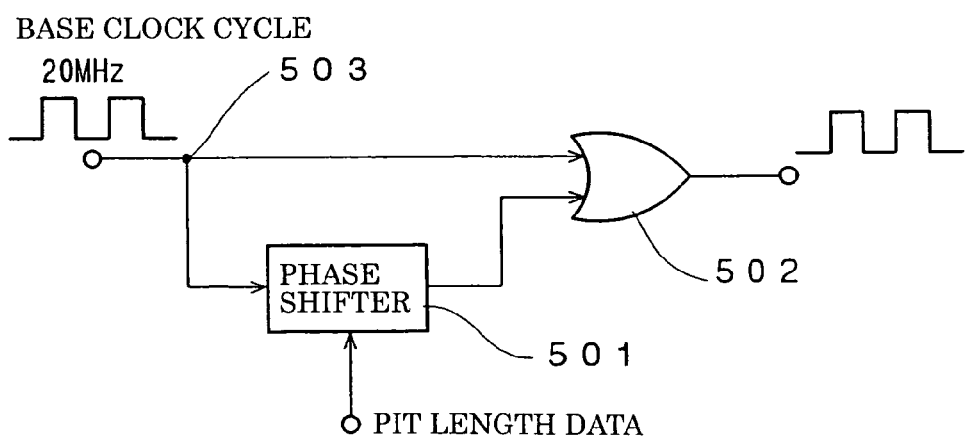
FIG. 5 is a block diagram of one example of a pulse signal generation circuit.

FIG. 5 is a block diagram of one example of a pulse signal generation circuit. As shown in FIG. 5, the pulse signal generation circuit includes a phase shifter 501 and a summer 502. The base clock cycle is divided into two base cycles at a bifurcating point 503 and one of the base clock cycles is input to the phase shifter 501. The base clock cycle is shifted by the phase shifter 501 by a predetermined shift amount and output from the phase shifter 501. The shift amount of the base clock cycle is determined based on pit length data input to the phase shifter 501. The summer 502 receives the original base clock cycle and the thus shifted base clock cycle and adds them to output the sum base clock cycle.

A method for manufacturing an optical recording disk using the thus fabricated stamper will be described later.

Figure 6:
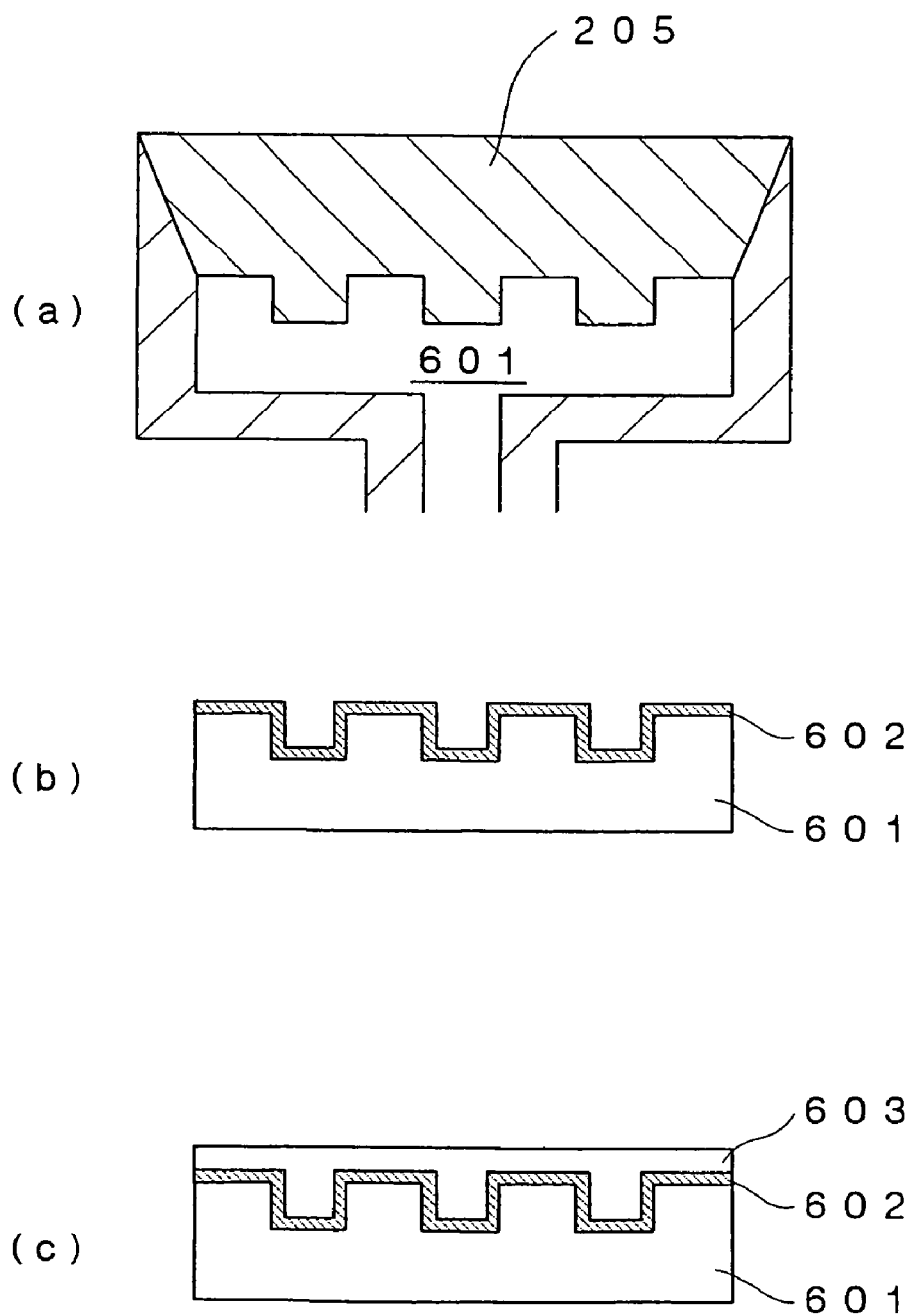
FIGS. 6(a) to 6(c) show steps for manufacturing an optical recording disk.
Figure 7:
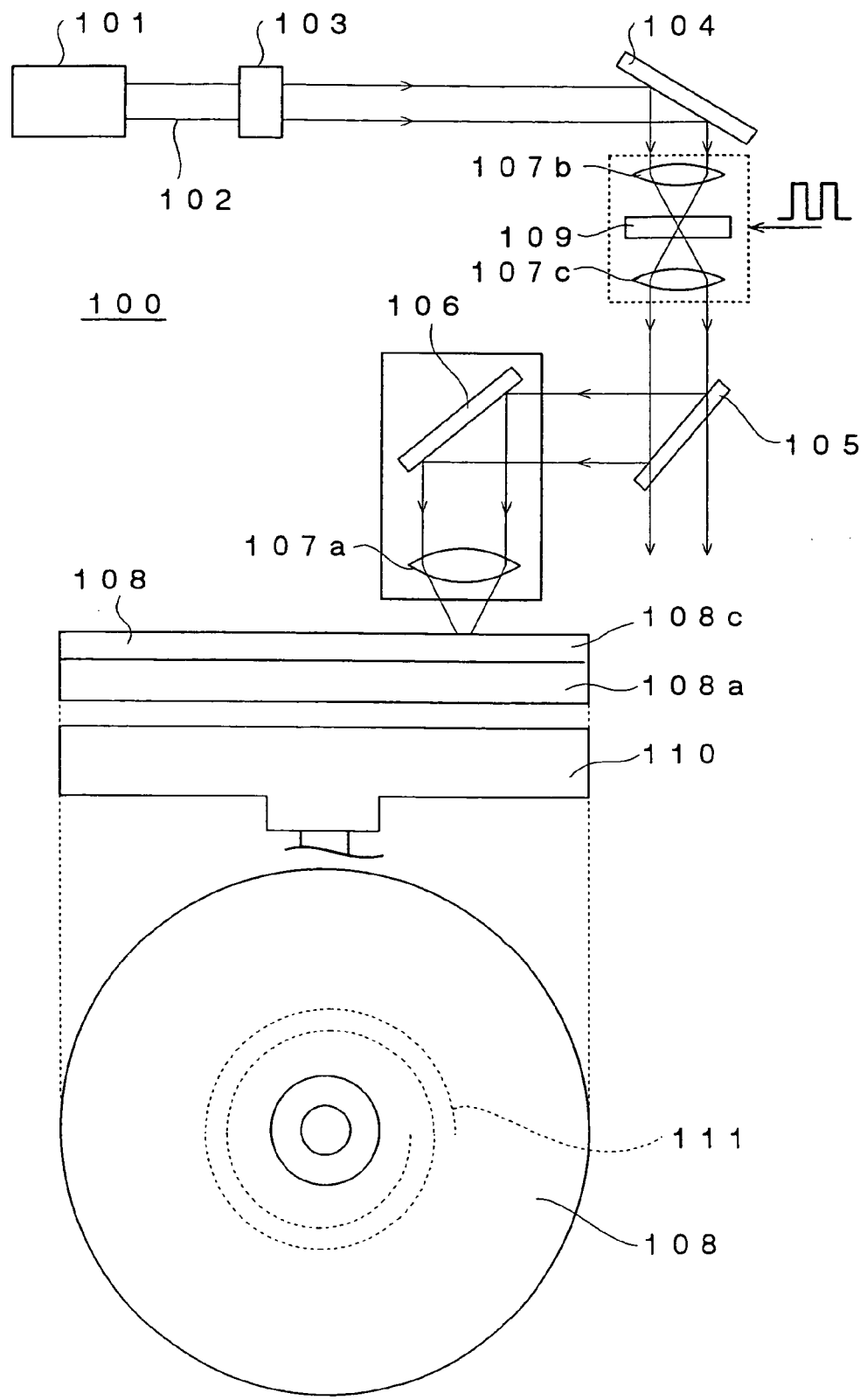
FIG. 7 is a diagram showing a method for manufacturing a stamper for an optical recording disk using a cutting machine 100.

FIGS. 6(a) to 6(c) show steps for manufacturing an optical recording disk. In a next-generation type optical recording disk having an extremely high data transfer rate, it is necessary to form a light transmission layer that is very much thinner than that of a CD or a DVD.

An optical recording disk substrate 601 having a thickness of about 1.1 mm is first fabricated by an injection molding process using the stamper 205 fabricated in the above described manner. Thereby obtaining an optical recording disk substrate 601 onto which the raised and depressed pattern on the surface of the stamper 205 has been transferred (FIG. 6(a)). The material for forming the optical recording disk substrate 601 is not particularly limited and polycarbonate, for example, may be used for forming the optical recording disk substrate 601. Further, the optical recording disk substrate 601 may be fabricated by a photo-setting process (2P process) using the stamper 205.

Next, as occasion demands, a sputtering apparatus is used to sputter metal onto the surface of the optical recording disk substrate 601 formed with the raised and depressed pattern. Thereby, a reflective film 602 is formed on the surface of the optical recording disk substrate 601 (FIG. 6(b)). It is preferable to form the reflective film 602 so as to have a thickness of 10 nm to 300 nm and to employ an alloy containing Ag as a primary component as the metal for forming the reflective film 602.

Then, ultraviolet ray curable resin is applied using a spin coating method, a roll coating method, a screen printing method or the like onto the surface of the optical recording disk substrate 601 formed with the raised and depressed pattern or the surface of the reflective film 602 and an ultraviolet ray is projected onto the ultraviolet ray curable resin to form a light transmission layer 603 having a thickness of about 10 μm to 300 μm (FIG. 6(c)). This completes the fabrication of the optical recording disk. Here, the light transmission layer 603 may be formed by adhering a resin sheet formed of polycarbonate, polyolefin or the like in advance onto the surface of the reflective film 602.

Further, a moisture-proof layer for preventing the reflective film 602 from being corroded may be formed between the optical recording disk substrate 601 and the reflective film 602 and/or the reflective film 602 and the light transmission layer 603.

As described above, according to this embodiment, since a pulse-like laser beam is intermittently projected onto the photoresist-coated glass board having the light absorption layer, it is possible even when a laser beam having a relatively long wavelength is used to form pre-pits so as to have a uniform width irrespective of the lengths of the pre-pits and, as a result, the track pitch can be narrowed. Therefore, it is possible to manufacture a stamper for an optical recording disk formed with pre-pits having a uniform pit width and a narrow track pitch.

More specifically, according to this embodiment, it is possible to manufacture a stamper for a next-generation type optical recording disk formed with pre-pits having track pitch of 0.32 µm and a shortest pit length of about 0.16 µm using a laser beam having a wavelength of 351 nm used for manufacturing a stamper for a DVD.

Further, according to this embodiment, since the power of the laser beam is modulated based on a pulse signal train having a proper duty ratio and the thus power-modulated pulse-like laser beam is intermittently projected onto the photoresist-coated glass board, even when a laser beam having a relatively long wavelength is used, pre-pits can be formed so as to have a uniform width irrespective of the lengths of the pre-pits and, as a result, the track pitch can be narrowed.

The present invention has thus been shown and described with reference to a specific embodiment. However, it should be noted that the present invention is in no way limited to the details of the described arrangements but changes and modifications may be made without departing from the scope of the appended claims.

For example, although in the above described embodiment the laser beam is intermittently projected onto the photoresist-coated glass board having the light absorption layer, it is not absolutely necessary to intermittently project the laser beam onto the photoresist-coated glass board having the light absorption layer and the laser beam may be intermittently projected onto a photoresist-coated glass board having no light absorption layer. Specifically, in the case where the power of the laser beam is modulated based on a pulse signal train having a proper duty ratio and the thus power-modulated pulse-like laser beam is intermittently projected onto a photoresist-coated glass board having no light absorption layer, pre-pits cannot be formed so accurately as in the case of employing the photoresist-coated glass board having the light absorption layer but it is nevertheless possible to make the pit widths of pre-pits sufficiently uniform and the track pitch considerably narrow as compared with the case where the power of a laser beam is modulated by a pulse signal train having pulse lengths determined based on the lengths of pre-pits to be formed and the thus power-modulated laser beam is projected onto the photoresist-coated glass board.

Further, in the above described embodiment, for example, although explanation was made as to the case where a stamper for an optical recording disk is fabricated using a photoresist-coated glass board, the present invention is not limited to such a case but can be widely applied for forming a fine raised and depressed pattern having a uniform width on a photoresist-coated glass board using a laser beam having a relatively long wavelength.

Furthermore, in the above described embodiment, for example, although the photoresist-coated glass board and the stamper for an optical recording disk are shaped to be disk-like, it is not absolutely necessary for the photoresist-coated glass board and the stamper for an optical recording disk to have disk-like shapes and the photoresist-coated glass board and the stamper for the optical recording disk may be shaped to be card-like in, for example, a rectangular form.

Moreover, in the above described embodiment, although explanation was made as to an optical recording disk, the present invention is not limited to an optical recording disk but can be widely applied to recording media including a magnetic disk that is, for example, a discrete medium.

Further, in the above described embodiment, for example, although the duty ratio of the laser pulse is controlled by shifting the base clock cycle using the pulse generation circuit including the phase shifter and the summer, it is not absolutely necessary to control the duty ratio of the laser pulse by shifting the base clock cycle using the pulse generation circuit including the phase shifter and the summer, and the duty ratio of the laser pulse may be controlled using any of various methods.

As described above, according to the present invention, it is possible to provide a method for processing a photoresist-coated board and a photoresist-coated board in which a fine raised and depressed pattern having a uniform width can be formed after development even in the case where a laser beam having a relatively long wavelength is used.

Therefore, according to the present invention, it is possible to manufacture a stamper for a next-generation type optical recording disk having a track pitch of 0.32 µm and a shortest pit length of about 0.16 µm using a cutting machine used for manufacturing a stamper for a conventional optical recording disk.

Further, according to the present invention, it is possible to provide a method for manufacturing a stamper for a recording medium which can make pit widths of pre-pits uniform irrespective of the pit lengths and the track pitch narrow even in the case where a laser beam having a relatively long wavelength is used, and a stamper for an optical recording medium formed with pre-pits having uniform and a narrow track pitch.

Furthermore, according to the present invention, it is possible to provide a method for manufacturing a recording medium which can make pit widths of pre-pits uniform irrespective of the pit lengths and the track pitch narrow even in the case where a laser beam having a relatively long wavelength is used, and a recording medium formed with pre-pits having uniform and a narrow track pitch.

The invention claimed is:

1. A method for processing a photoresist-coated board comprising steps of intermittently projecting a pulse-like laser beam onto a photosensitive material layer on or above a light absorption layer provided in the photoresist-coated board to expose the photosensitive material layer to the laser beam, and developing the photosensitive material layer, thereby forming a raised and depressed pattern on the photosensitive material layer, wherein when a length of a depressed portion or a projecting portion of the raised and depressed pattern is shorter than a predetermined length, a duty ratio of the pulse-like laser beam is varied in accordance with the length of the depressed portion or the projecting portion of the raised and depressed pattern, and when the length of the depressed portion or the projecting portion of the raised and depressed pattern is equal to or longer than the predetermined length, the duty ratio of the pulse-like laser beam is kept constant independently of the length of the depressed portion or the projecting portion of the raised and depressed pattern, thereby exposing the photosensitive material layer to the laser beam.

2. A method for processing a photoresist-coated board comprising steps of intermittently projecting a pulse-like laser beam onto a photosensitive material layer provided in the photoresist-coated board to expose the photosensitive material layer to the laser beam, and developing the photosensitive material layer, thereby forming a raised and depressed pattern on the photosensitive material layer, wherein the method for processing a photoresist-coated board further comprises a step of varying a duty ratio of the pulse-like laser beam in accordance with a length of a depressed portion or a projecting portion of the raised and depressed pattern to be formed wherein when the length of the depressed portion or the projecting portion of the raised and depressed pattern is shorter than a predetermined length, the duty ratio of the pulse-like laser beam is varied in accordance with the length of the depressed portion or the projecting portion of the raised and depressed pattern, and when the length of the depressed portion or the projecting portion of the raised and depressed pattern is equal to or longer than the predetermined length, the duty ratio of the pulse-like laser beam is kept constant independently of the length of the depressed portion or the projecting portion of the raised and depressed pattern, thereby exposing the photosensitive material layer to the laser beam.

3. A method for manufacturing a stamper for a recording medium comprising a step of intermittently projecting a pulse-like laser beam onto a photosensitive material layer on or above a light absorption layer provided in the photoresist-coated board to expose the photosensitive material layer to the laser beam, and developing the photosensitive material layer, thereby forming a raised and depressed pattern on the photosensitive material layer and a step for transferring the raised and depressed pattern formed on the photosensitive material layer onto the stamper for a recording medium, thereby forming a raised and depressed pattern on the stamper for an optical recording medium wherein when a length of a depressed portion or a projecting portion of the raised and depressed pattern is shorter than a predetermined length, a duty ratio of the pulse-like laser beam is varied in accordance with the length of the depressed portion or the projecting portion of the raised and depressed pattern, and when the length of the depressed portion or the projecting portion of the raised and depressed pattern is equal to or longer than the predetermined length, the duty ratio of the pulse-like laser beam is kept constant independently of the length of the depressed portion or the projecting portion of the raised and depressed pattern, thereby exposing the photosensitive material layer to the laser beam.

4. A method for manufacturing a stamper for a recording medium comprising a step of forming a raised and depressed pattern on a photosensitive material layer provided in a photoresist-coated board by intermittently projecting a pulse-like laser beam onto the photosensitive material layer to expose the photosensitive material layer thereto and developing the photosensitive material layer, and a step of transferring the raised and depressed pattern formed on the photosensitive material layer onto a stamper for a recording medium and forming a raised and depressed pattern on the stamper, wherein the method for manufacturing a stamper for a recording medium further comprises a step of varying a duty ratio of the pulse-like laser beam in accordance with a length of a depressed portion or a projecting portion of the raised and depressed pattern to be formed, wherein when the length of the depressed portion or the projecting portion of the raised and depressed pattern is shorter than a predetermined length, the duty ratio of the pulse-like laser beam is varied in accordance with the length of the depressed portion or the projecting portion of the raised and depressed pattern, and when the length of the depressed portion or the projecting portion of the raised and depressed pattern is equal to or longer than the predetermined length, the duty ratio of the pulse-like laser beam is kept constant independently of the length of the depressed portion or the projecting portion of the raised and depressed pattern, thereby exposing the photosensitive material layer to the laser beam.

5. A method for manufacturing a stamper for a recording medium comprising:
    forming a raised and depressed pattern including a depressed portion or a projecting portion corresponding to a pit on a photosensitive material layer on or above a light absorption layer provided in a photoresist-coated board by projecting two or more pulses of a laser beam onto the photosensitive material layer to expose the photosensitive material layer thereto and developing the photosensitive material layer; and
    transferring the raised and depressed pattern formed on the photosensitive material layer onto a stamper for a recording medium and forming a raised and depressed pattern on the stamper,
    wherein a duty ratio of the pulse-like laser beam is varied in accordance with a length of a depressed portion or a projecting portion of the raised and depressed pattern to be formed, and
    wherein when a length of a depressed portion or a projecting portion of the raised and depressed pattern is shorter than a predetermined length, the duty ratio of the pulse-like laser beam is varied in accordance with the length of the depressed portion or the projecting portion of the raised and depressed pattern and when a length of a depressed portion or a projecting portion of the raised and depressed pattern is equal to or longer than a predetermined length, the duty ratio of the pulse-like laser beam is kept constant independently of the length of the depressed portion or the projecting portion of the raised and depressed pattern, thereby exposing the photosensitive material layer to the laser beam.

6. A method for manufacturing a recording medium comprising:
    forming a raised and depressed pattern including a depressed portion or a projecting portion corresponding to a pit on a photosensitive material layer on or above a light absorption layer provided in a photoresist-coated board by projecting two or more pulses of a laser beam onto the photosensitive material layer to expose the photosensitive material layer thereto and developing the photosensitive material layer;
    transferring the raised and depressed pattern formed on the photosensitive material layer onto a stamper for a recording medium and forming a raised and depressed pattern on the stamper; and
    transferring the raised and depressed pattern formed on the stamper onto a substrate for a recording medium to form pre-pits on the substrate.
    wherein a duty ratio of the pulse-like laser beam is varied in accordance with a length of a depressed portion or a projecting portion of the raised and depressed pattern to be formed, and
    wherein when a length of a pre-pit is shorter than a predetermined length, the duty ratio of the pulse-like laser beam is varied in accordance with the length of the pre-pit and when a length of a pre-pit is equal to or longer than a predetermined length, the duty ratio of the laser beam is kept constant independently of the length of the pre-pit, thereby exposing the photosensitive material layer to the laser beam.

7. A method for manufacturing a recording medium in accordance with claim 6 wherein the duty ratio of the pulse-like laser beam is varied so that the photosensitive material layer is exposed to the laser beam by setting the duty ratio of the pulse-like laser beam to a first value when a pre-pit having a first length is to be formed and that the photosensitive material layer is exposed to the laser beam by setting the duty ratio of the pulse-like laser beam to a second value smaller than the first value when a pre-pit having a second length longer than the first length is to be formed.

8. A method for manufacturing a recording medium comprising:

forming a raised and depressed pattern including a depressed portion or a projecting portion corresponding to a pit on a photosensitive material layer provided in a photoresist-coated board by projecting two or more pulses of a laser beam onto the photosensitive material layer to expose the photosensitive material layer thereto and developing the photosensitive material layer;

transferring the raised and depressed pattern formed on the photosensitive material layer onto a stamper for an optical recording medium and forming a raised and depressed pattern on the stamper;

transferring the raised and depressed pattern formed on the stamper onto a substrate for a recording medium to form pre-pits on the substrate; and varying a duty ratio of the pulse-like laser beam in accordance with a length of a pre-pit to be formed, and wherein when a length of a pre-pit is shorter than a predetermined length, the duty ratio of the pulse-like laser beam is varied in accordance with the length of the pre-pit and when a length of a pre-pit is equal to or longer than a predetermined length, the duty ratio of the pulse-like laser beam is kept constant independently of the length of the pre-pit, thereby exposing the photosensitive material layer to the laser beam.

9. A method for manufacturing a recording medium in accordance with claim 8, wherein the duty ratio of the pulse-like laser beam is varied so that the photosensitive material layer is exposed to the laser beam by setting the duty ratio of the pulse-like laser beam to a first value when a pre-pit having a first length is to be formed and that the photosensitive material layer is exposed to the laser beam by setting the duty ratio of the pulse-like laser beam to a second value smaller than the first value when a pre-pit having a second length longer than the first length is to be formed.

* * * * *

UNITED STATES PATENT AND TRADEMARK OFFICE
CERTIFICATE OF CORRECTION

PATENT NO.       : 7,297,472 B2                                             Page 1 of 1
APPLICATION NO.  : 10/507429
DATED            : November 20, 2007
INVENTOR(S)      : Hisaji Oyake et al.

It is certified that error appears in the above-identified patent and that said Letters Patent is hereby corrected as shown below:

On the Title page, Section (54)
Title, "PROCESSING METHOD FOR PHOTORESIST MASTER, PRODUCTION METHOD FOR RECORDING MEDIUM-USE MATER, PRODUCTION METHOD FOR RECORDING MEDIUM, PHOTORESIST MASTER, RECORDING MEDIUM-USE MASTER AND RECORDING MEDIUM" should read as --METHOD FOR PROCESSING A PHOTORESIST-COATED GLASS BOARD, A METHOD FOR MANUFACTURING A STAMPER FOR A RECORDING MEDIUM, A METHOD FOR MANUFACTURING A RECORDING MEDIUM, A PHOTORESIST-COATED GLASS BOARD, A STAMPER FOR A RECORDING MEDIUM, AND A RECORDING MEDIUM--

Signed and Sealed this

Seventeenth Day of February, 2009

JOHN DOLL
*Acting Director of the United States Patent and Trademark Office*

UNITED STATES PATENT AND TRADEMARK OFFICE
CERTIFICATE OF CORRECTION

PATENT NO.         : 7,297,472 B2                                              Page 1 of 1
APPLICATION NO. : 10/507429
DATED              : November 20, 2007
INVENTOR(S)        : Hisaji Oyake et al.

It is certified that error appears in the above-identified patent and that said Letters Patent is hereby corrected as shown below:

On the Title page, Section (54) and Column 1, lines 1-7
Title, "PROCESSING METHOD FOR PHOTORESIST MASTER, PRODUCTION METHOD FOR RECORDING MEDIUM-USE MATER, PRODUCTION METHOD FOR RECORDING MEDIUM, PHOTORESIST MASTER, RECORDING MEDIUM-USE MASTER AND RECORDING MEDIUM" should read as --METHOD FOR PROCESSING A PHOTORESIST-COATED GLASS BOARD, A METHOD FOR MANUFACTURING A STAMPER FOR A RECORDING MEDIUM, A METHOD FOR MANUFACTURING A RECORDING MEDIUM, A PHOTORESIST-COATED GLASS BOARD, A STAMPER FOR A RECORDING MEDIUM, AND A RECORDING MEDIUM--

This certificate supersedes the Certificate of Correction issued February 17, 2009.

Signed and Sealed this

Seventeenth Day of March, 2009

JOHN DOLL
*Acting Director of the United States Patent and Trademark Office*